(12) United States Patent
Chen et al.

(10) Patent No.: US 10,736,420 B2
(45) Date of Patent: Aug. 11, 2020

(54) BRACKET DEVICE

(71) Applicants: KING SLIDE WORKS CO., LTD.,
Kaohsiung (TW); KING SLIDE TECHNOLOGY CO., LTD.,
Kaohsiung (TW)

(72) Inventors: Ken-Ching Chen, Kaohsiung (TW);
Shun-Ho Yang, Kaohsiung (TW);
Kai-Wen Yu, Kaohsiung (TW);
Chun-Chiang Wang, Kaohsiung (TW)

(73) Assignees: KING SLIDE WORKS CO., LTD.,
Kaohsiung (TW); KING SLIDE TECHNOLOGY CO., LTD.,
Kaohsiung (TW)

( * ) Notice: Subject to any disclaimer, the term of this patent is extended or adjusted under 35 U.S.C. 154(b) by 0 days.

(21) Appl. No.: 16/352,803

(22) Filed: Mar. 13, 2019

(65) Prior Publication Data
US 2020/0146446 A1 May 14, 2020

(30) Foreign Application Priority Data
Nov. 12, 2018 (TW) .............................. 107140307 A

(51) Int. Cl.
*A47B 88/407* (2017.01)
*A47B 57/38* (2006.01)
(Continued)

(52) U.S. Cl.
CPC ............ *A47B 88/407* (2017.01); *A47B 57/38* (2013.01); *A47B 96/07* (2013.01); *A47B 88/43* (2017.01)

(58) Field of Classification Search
CPC ....... A47B 88/43; A47B 88/407; A47B 57/38; A47B 96/07; A47B 2210/0054;
(Continued)

(56) References Cited

U.S. PATENT DOCUMENTS 6,891,727 B2  5/2005  Dittus
6,935,711 B1*  8/2005  Naue ..................... A47B 88/43
                                              312/223.1
(Continued)

FOREIGN PATENT DOCUMENTS

JP      3179651 U    11/2012
JP      2017-38034 A  2/2017
JP      2018-75353 A  5/2018

*Primary Examiner* — Ingrid M Weinhold
(74) *Attorney, Agent, or Firm* — Winston Hsu

(57) ABSTRACT

A bracket device includes a bracket, a fastening member and a resilient member. The bracket includes a longitudinal wall and at least one mounting member mounted adjacent thereto. The fastening member is longitudinally displaceable with respect to the bracket and includes a side wall and a fastening portion bent with respect to the side wall. The resilient member is for providing a resilient force to the bracket and the fastening member. The bracket is arranged with a first engaging feature, and the fastening member is arranged with a second engaging feature. When the fastening member displaces with respect to the bracket from a first position to a second position, the fastening portion is close to the at least one mounting member, and the first engaging feature is engaged with the second engaging feature, such that the fastening member is kept at the second position with respect to the bracket.

14 Claims, 8 Drawing Sheets

(51) Int. Cl.
  *A47B 96/07* (2006.01)
  *A47B 88/43* (2017.01)
(58) Field of Classification Search
  CPC .... A47B 2210/0059; A47B 2210/0051; H05K 7/1489; F16M 13/022; F16B 2/12
  USPC ............. 312/334.5, 334.4, 265.1–265.4; 248/219.3, 298.1; 211/192
  See application file for complete search history.

(56) References Cited

U.S. PATENT DOCUMENTS

| | | | |
|---|---|---|---|
| 7,703,734 B2 | 4/2010 | Chen | |
| 7,798,582 B2 | 9/2010 | Yu | |
| 8,550,416 B2 | 10/2013 | Yu | |
| 8,967,565 B2* | 3/2015 | Chen | A47B 88/43 248/221.11 |
| 9,723,924 B1 | 8/2017 | Chiu | |
| 10,051,759 B1 | 8/2018 | Chen | |
| 2009/0166485 A1* | 7/2009 | Chen | A47B 88/43 248/200 |
| 2012/0193489 A1 | 8/2012 | Yu | |
| 2014/0070064 A1* | 3/2014 | Chen | A47B 88/43 248/221.11 |
| 2017/0020022 A1 | 1/2017 | Chang | |
| 2019/0390692 A1* | 12/2019 | Li | F16B 2/12 |

\* cited by examiner

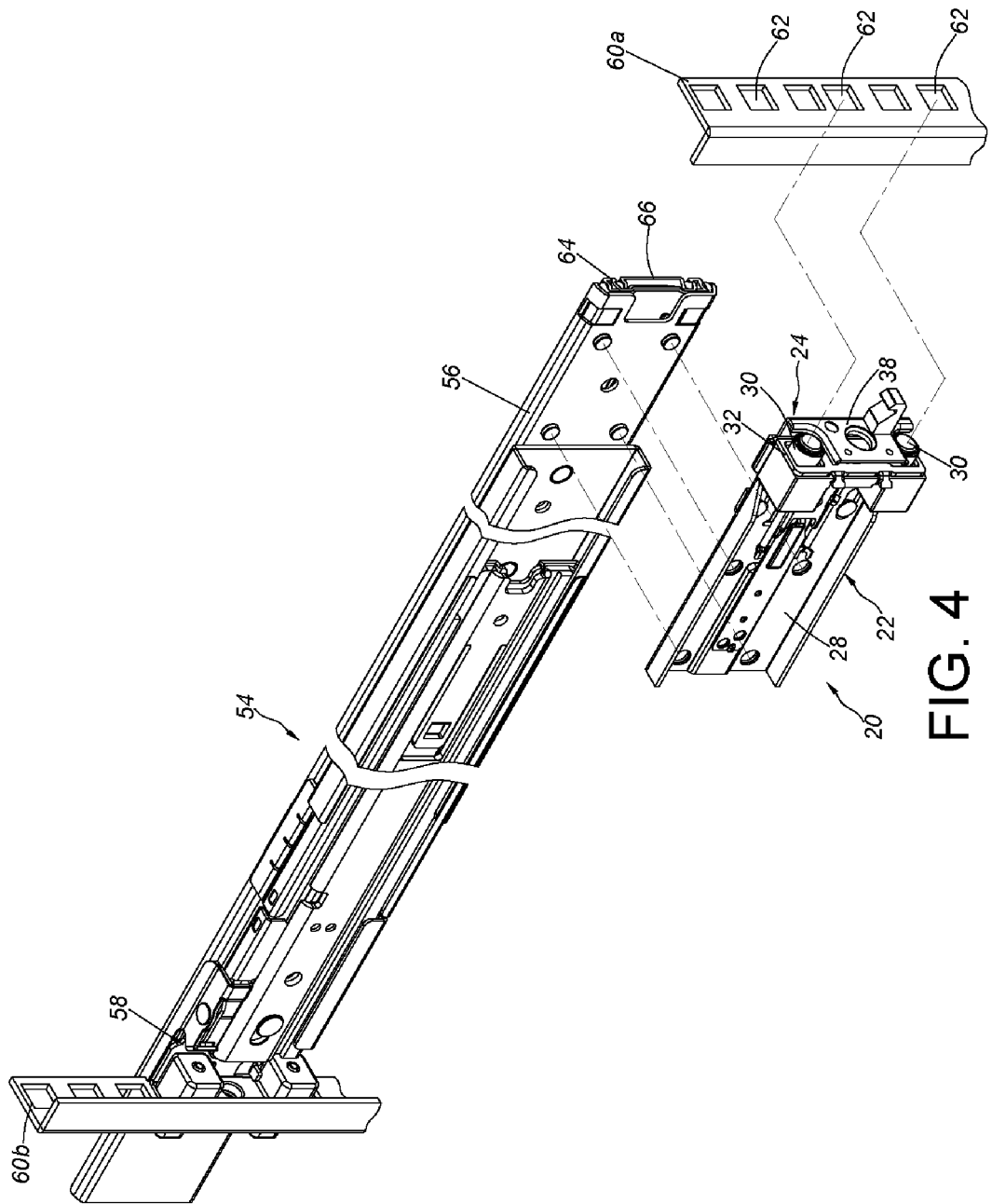

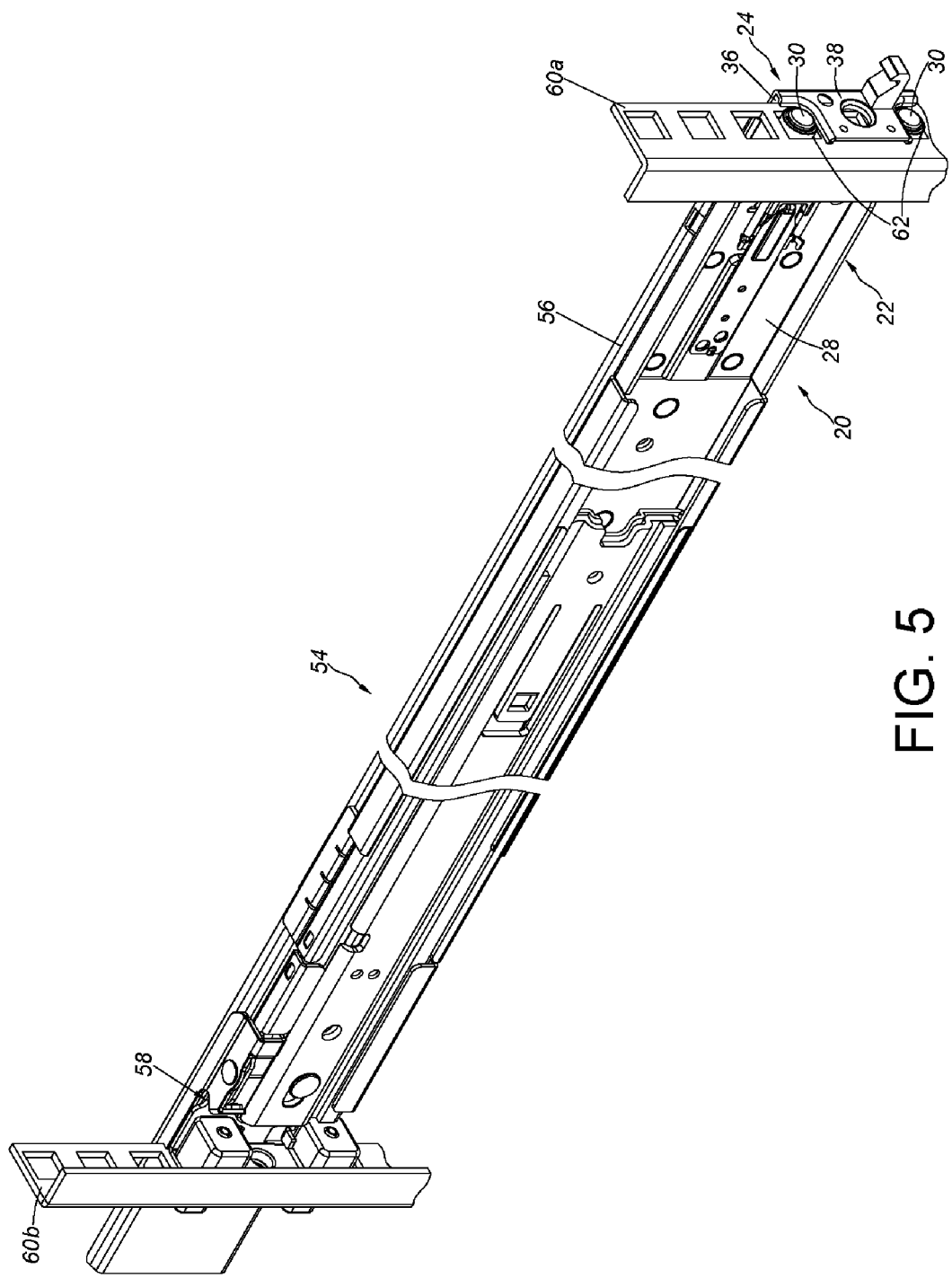

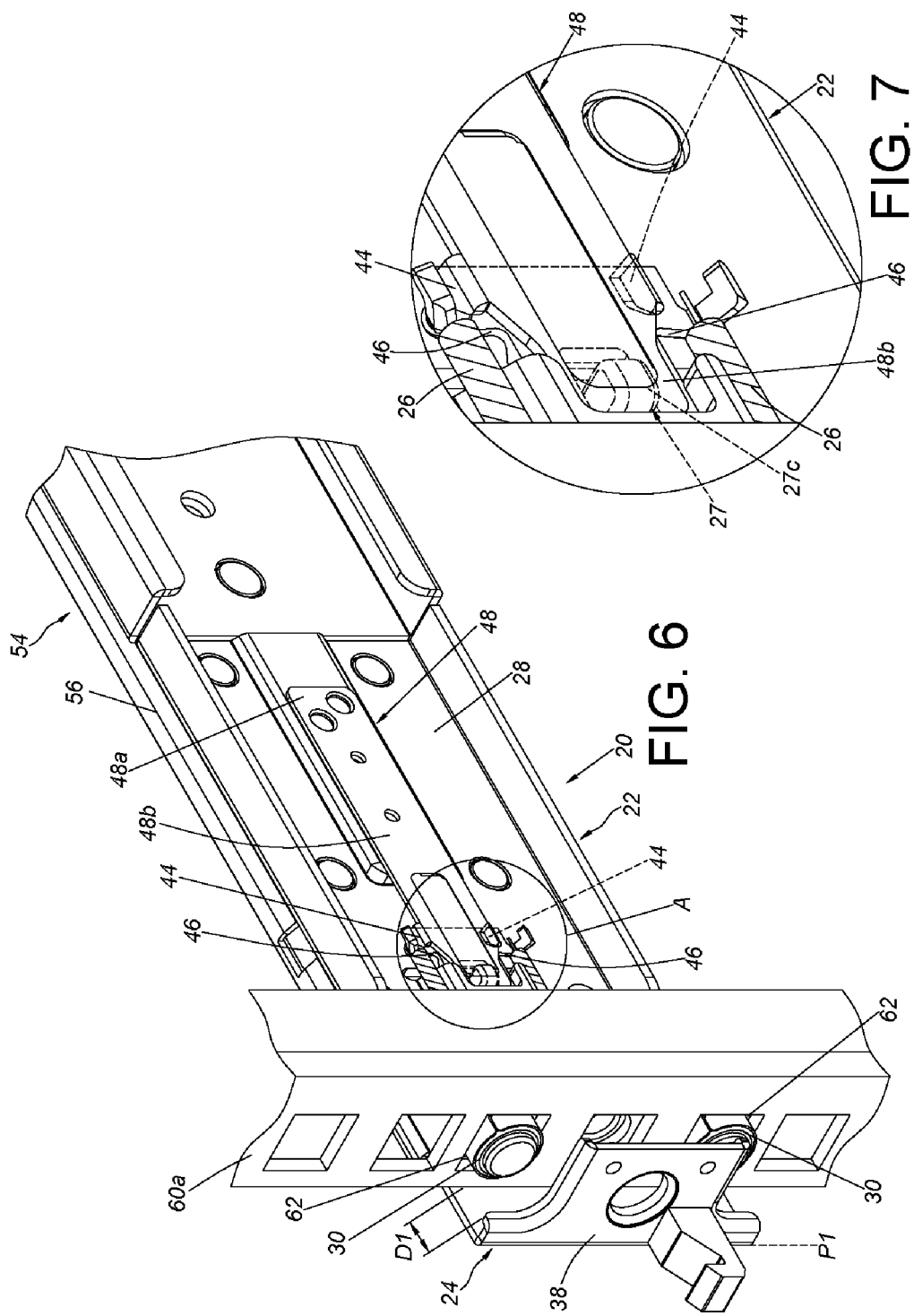

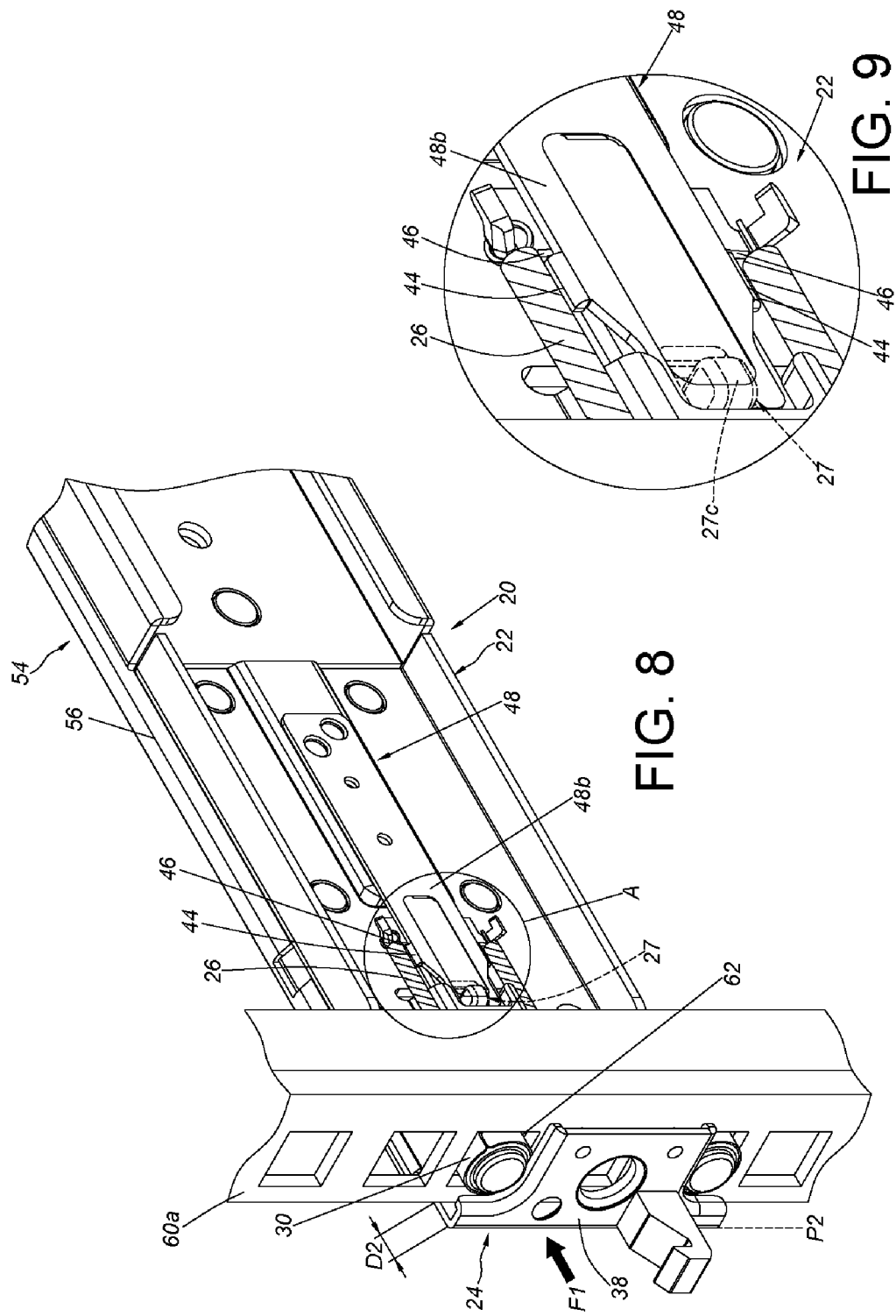

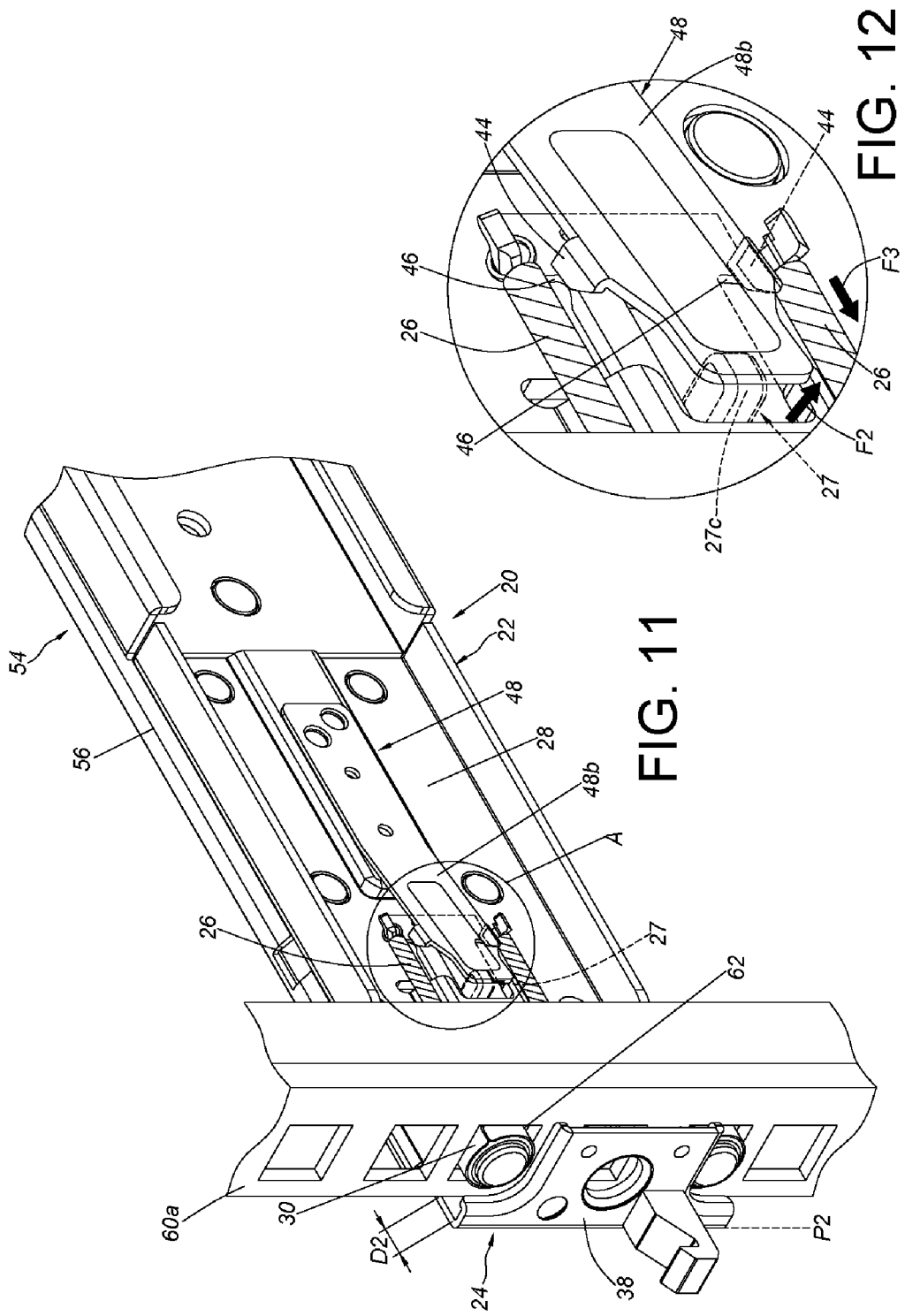

BRACKET DEVICE

BACKGROUND OF THE INVENTION

1. Field of the Invention

The present invention relates to a bracket structure, and more particularly, to a bracket device which is convenient for users to operate.

2. Description of the Prior Art

In rack systems, a bracket is conventionally applied to mount a slide rail to a post of a rack. For example, the US patent with U.S. Pat. No. 7,703,734 B2 discloses a slide mounting bracket structure including a main bracket (1), an auxiliary bracket (2), a first engaging member (3), a second engaging member (4), an actuating element (5) and a linking member (6). In the slide mounting bracket structure, the main bracket (1) and the auxiliary bracket (2) are movable with respect to each other, and an elastic element (23) provides an elastic force to the main bracket (1) and the auxiliary bracket (2). The actuating element (5) cooperates with the first engaging member (3), and the linking member (6) cooperates with the second engaging member (4). As shown in FIG. 10 and FIG. 11 of the US patent with U.S. Pat. No. 7,703,734 B2, when the actuating element (5) is operated to move the first engaging member (3) away from a position, the elastic force of the elastic element (23) can be released. As such, the auxiliary bracket (2) moves toward the main bracket (1) to form a locking state, in which the slide mounting bracket structure is locked to a post (A) of a rack via a hanging pole (222) and a folded plate (13).

Thus, development of different brackets for different operation demands for the brackets becomes an important issue in the industry.

SUMMARY OF THE INVENTION

According to one aspect of the present invention, a bracket device includes a bracket, a fastening member and a resilient member. The bracket includes a longitudinal wall and at least one mounting member mounted adjacent to the longitudinal wall. The fastening member is longitudinally displaceable with respect to the bracket. The fastening member includes a side wall and a fastening portion bent with respect to the side wall. The resilient member is for providing a resilient force to the bracket and the fastening member. The bracket is arranged with a first engaging feature, and the fastening member is arranged with a second engaging feature. When the fastening member displaces with respect to the bracket from an unlocking position to a locking position, the fastening portion is close to the at least one mounting member, and the first engaging feature is engaged with the second engaging feature, such that the fastening member is kept at the locking position with respect to the bracket, and the resilient member maintains a resilient force. The resilient force is for recovering the fastening member to the unlocking position.

Preferably, the bracket further includes an end wall substantially perpendicularly connected to the longitudinal wall, and the at least one mounting member is mounted on the end wall.

Preferably, the fastening member is substantially perpendicularly connected to the side wall.

Preferably, the longitudinal wall of the bracket is arranged with a first constraining feature, the side wall of the fastening member is arranged with a second constraining feature, and the first constraining feature cooperates with the second constraining feature.

Preferably, the longitudinal wall of the bracket is connected to a slide rail.

Preferably, the bracket device further includes an engaging member, the engaging member includes a connecting portion and a resilient arm, the connecting portion is connected to the longitudinal wall of the bracket, the resilient arm is extended from the connecting portion, and the resilient arm has the first engaging feature for being engaged with the second engaging feature of the side wall of the fastening member when the fastening member is at the locking position.

Preferably, an elongated hole is formed on the side wall of the fastening member, the bracket device further includes an operating member, the operating member has a fixing portion and an operating portion, the fixing portion is connected to the longitudinal wall of the bracket via a fixing member passing through the elongated hole, the operating portion is flexibly connected to the fixing portion, the operating portion has a contacting feature passing through the elongated hole, and the contacting feature is corresponding to the resilient arm of the engaging member.

According to another aspect of the present invention, a bracket device includes a bracket, a fastening member and a resilient member. The bracket includes a longitudinal wall and at least one mounting member mounted adjacent to the longitudinal wall. The fastening member is displaceable with respect to the bracket. The fastening member includes a side wall and a fastening portion bent with respect to the side wall. The bracket is arranged with a first engaging feature, and the fastening member is arranged with a second engaging feature. When the fastening member displaces with respect to the bracket from a first position to a second position, the fastening portion is close to the at least one mounting member, and the first engaging feature is engaged with the second engaging feature, such that the fastening member is kept at the second position with respect to the bracket, and the resilient member maintains a resilient force. When the first engaging feature is disengaged from the second engaging feature, the fastening member recovers to the first position from the second position with respect to the bracket in response to the resilient force released from the resilient member, such that the fastening portion is away from the at least one mounting member.

According to yet another aspect of the present invention, a bracket device is adapted to mount a slide rail to a post with a plurality of holes formed thereon. The bracket device includes a bracket, a fastening member and a resilient member. The bracket includes a longitudinal wall and a mounting member mounted adjacent to the longitudinal wall, the longitudinal wall is connected to the slide rail, and the mounting member is for being mounted to one of the holes of the post. The fastening member is longitudinally displaceable with respect to the bracket. The fastening member includes a side wall and a fastening portion bent with respect to the side wall. The resilient member is for providing resilient force to the bracket and the fastening member. The bracket is arranged with a first engaging feature, and the fastening member is arranged with a second engaging feature. When the fastening member displaces with respect to the bracket from a first position to a second position, the fastening portion is close to the post for locking the post, and the first engaging feature is engaged with the second engaging feature, such that the fastening member is kept at the second position with respect to the bracket, and the resilient member maintains a resilient force. The resilient force is for recovering the fastening member to the first position, such that the fastening portion is away from the post and no longer locks the post.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a diagram showing the bracket device capable of being connected to a slide rail of a slide rail assembly and configured to mount the slide rail assembly to a rack according to the embodiment of the present invention.

FIG. 5 is a diagram showing the slide rail assembly being mounted to the rack through the bracket device according to the embodiment of the present invention.

FIG. 6 is a diagram showing the bracket device of the slide rail being mounted to the rack through a mounting member, in which a fastening member is located at a first position according to the embodiment of the present invention.

FIG. 7 is an enlarged view of a portion A of FIG. 6.

FIG. 8 is a diagram showing the bracket device of the slide rail being mounted to the rack through the mounting member, in which the fastening member is located at a second position for locking the rack according to the embodiment of the present invention.

FIG. 9 is an enlarged view of a portion A of FIG. 8.

FIG. 11 is a diagram showing the fastening member of the bracket device of the slide rail located at the second position, in which the operating member is pushed by the force so as to push against a resilient arm of an engaging member according to the embodiment of the present invention.

FIG. 12 is an enlarged view of a portion A of FIG. 11.

DETAILED DESCRIPTION

Figure 1:
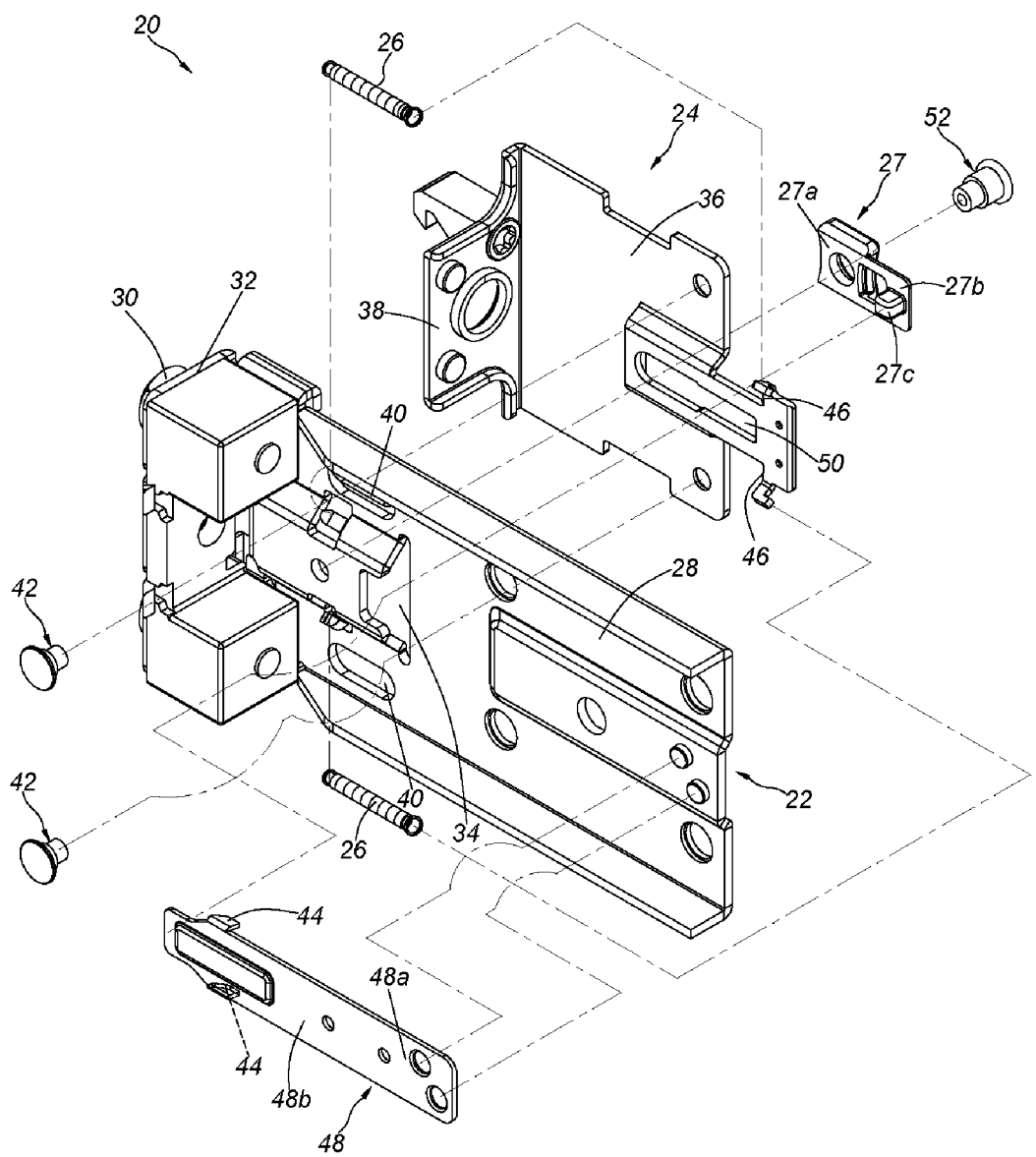
FIG. 1 is an exploded diagram of a bracket device according to an embodiment of the present invention.
Figure 2:
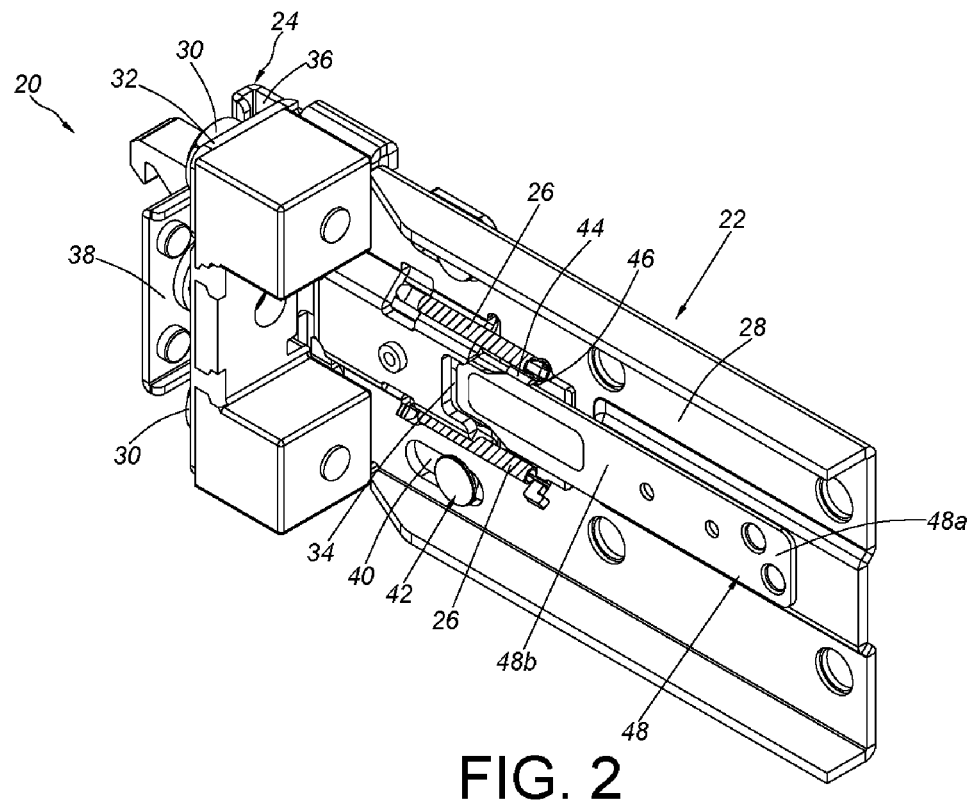
FIG. 2 is an assembly diagram of the bracket device according to the embodiment of the present invention.
Figure 3:
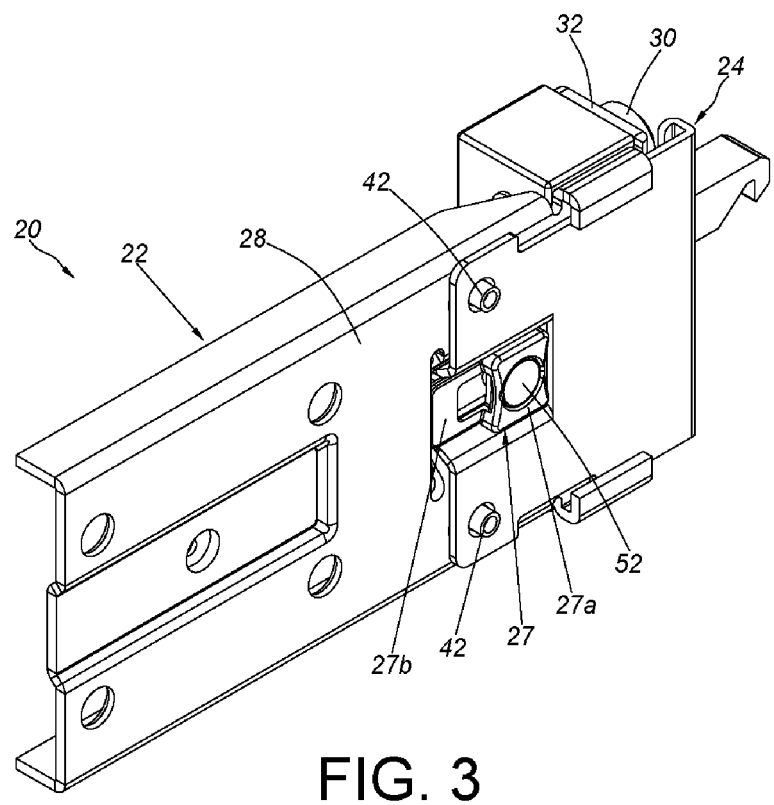
FIG. 3 is an assembly diagram of the bracket device in another view angle according to the embodiment of the present invention.

Please refer to FIG. 1, FIG. 2 and FIG. 3. The bracket device 20 of an embodiment of the present invention includes a bracket 22, a fastening member 24 and at least one resilient member 26. Preferably, the bracket device 20 can further include an operating member 27. In the following detailed description of the embodiments, the phrase "substantially perpendicularly connected to" refers that a member/feature is configured to be perpendicularly connected to the other member/feature. However, due to manufacturing tolerance or other factors, the member/feature is not perfectly perpendicularly connected to the other member/feature. For example, an included angle between the member/feature and the other member/feature ranging from degrees to 95 degrees and an included angle between the member/ feature and the other member/feature ranging from 88 degrees to 92 degrees are within the scope of the present invention.

The bracket 22 includes a longitudinal wall 28 and at least one mounting member 30 mounted adjacent to the longitudinal wall 28. Preferably, the bracket 22 can further include an end wall 32 substantially perpendicularly connected to the longitudinal wall 28. The at least one mounting member 30 is mounted on the end wall 32. Preferably, a through opening 34 is formed on the longitudinal wall 28.

The fastening member 24 is displaceable, such as longitudinally displaceable, with respect to the bracket 22. The fastening member 24 includes a side wall 36 and a fastening portion 38 bent with respect to the side wall 36, and the fastening portion is corresponding to the mounting member 30. Preferably, the fastening portion 38 is substantially perpendicularly connected to the side wall 36. Preferably, the longitudinal wall 28 of the bracket 22 is arranged with a first constraining feature 40, the side wall 36 of the fastening member 24 is arranged with a second constraining feature 42, and the first constraining feature 40 cooperates with the second constraining feature 42. For example, the first constraining feature 40 and the second constraining feature 42 are a long hole (herein, a longitudinally long hole or longitudinally long slot) and a protruding object, respectively. For example, the protruding object can be a connecting element fixed on the fastening member 24 and thus can be regarded as a portion of the fastening member 24. The second constraining feature 42 passes through a portion of the longitudinally long hole and is limited between two end walls of the longitudinally long hole. However, the structures of the first constraining feature 40 and the second constraining feature 42 are not limited thereto. In the embodiment, the number of the first constraining features 40 and the number of the second constraining features 42 are two, which is only exemplary, and the present invention is not limited thereto. For example, the number of the first constraining feature 40 and the number of the second constraining feature 42 can be one. That is, only one first constraining feature 40 is arranged on the longitudinal wall 28 of the bracket 22, such as the first constraining feature 40 located at the upper portion of the longitudinal wall 28 shown in FIG. 1 or the first constraining feature 40 located at the lower portion of the longitudinal wall 28 shown in FIG. 1, and the only one second constraining feature 42 can be disposed at the side wall 36 of the fastening member 24 corresponding to the first constraining feature 40.

The number of the resilient members 26 is two, and the two resilient members 26 are disposed on the longitudinal wall 28 and are corresponding to each other. However, the present invention is not limited thereto. For example, the number of the resilient member 26 can be one, such as the resilient member 26 located at the upper portion of the longitudinal wall 28 shown in FIG. 2 or the resilient member 26 located at the lower portion of the longitudinal wall 28 shown in FIG. 2. Specifically, each of the resilient members 26 is for providing a resilient force to the bracket 22 and the fastening member 24. Preferably, the resilient member 26 can be a spring, and two ends of the spring are respectively connected to the bracket 22 and the fastening member 24.

The bracket 22 is arranged with a first engaging feature 44, and the fastening member 24 is arranged with a second engaging feature 46. Preferably, the bracket device 20 further includes an engaging member 48 disposed at the bracket 22. The engaging member 48 includes a connecting portion 48a and a resilient arm 48b. The connecting portion 48a is connected to the longitudinal wall 28 of the bracket 22 (such as by riveting, screwing or welding). The resilient arm 48b is extended from the connecting portion 48a, and the resilient arm 48b has the first engaging feature 44. The first engaging feature 44, such as a protruding hook, can pass through the through opening 34 of the longitudinal wall 28 of the bracket 22. On the other hand, the second engaging feature 46 of the fastening member 24 can be a wall surface or an edge of the side wall 36, but the present invention is not limited thereto.

Preferably, an elongated hole 50 (such as a longitudinally elongated hole) can be formed on the side wall 36 of the fastening member 24. The operating member 27 has a fixing portion 27a and an operating portion 27b, the fixing portion 27a is connected to the longitudinal wall 28 of the bracket 22 via a fixing member 52 passing through the elongated hole 50, and the operating portion 27b is flexibly connected to the fixing portion 27a. Preferably, the operating portion 27b has a contacting feature 27c (such as a bulge) passing through the elongated hole 50 and the through opening 34, and the contacting feature 27c is corresponding to the resilient arm 48b of the engaging member 48.

As shown in FIG. 4 and FIG. 5, the bracket device 20 can be applied to a slide rail assembly 54. A slide rail 56 of the slide rail assembly 54 can be mounted to a first post 60a and a second post 60b of a rack via the bracket device 20 and another bracket device 58. The first post 60a has a plurality of holes 62 formed thereon. Specifically, the longitudinal wall 28 of the bracket 22 of the bracket device 20 is connected to a side of the slide rail 56, and the at least one mounting member 30 of the bracket 22 is for being mounted to one of the holes 62 of the first post 60a. In the embodiment, in addition to the slide rail 56, the slide rail assembly 54 further includes two slide rails, such as a middle rail 64 and an inner rail 66. The longitudinal wall 28 of the bracket 22 is located at the side of the slide rail 56, and the middle rail 64 and the inner rail 66 are disposed at another side of the slide rail 56. The middle rail 64 is movably mounted between the slide rail 56 (i.e., outer rail) and the inner rail 66, and the middle rail 64 is for extending the displacement of the inner rail 66 with respect to the slide rail 56. However, the present invention is not limited thereto. The number and the configuration of the slide rails disposed in the slide rail 56 can be flexibly adjusted according to practical demands, and the slide rails which can be disposed in the slide rail 56 and can be displaceable with respect to the slide rail 56 are within the scope of the present invention.

As shown in FIG. 6, when the fastening member 24 of the bracket device 20 is at a first position P1 (such as an unlocking position) with respect to the bracket 22, a first distance D1 is between the fastening portion 38 of the fastening member 24 and the mounting member 30 (or the end wall 32) of the bracket 22, and the mounting member 30 of the bracket 22 can be correspondingly inserted into one of the holes 62 of the first post 60a. Meanwhile, the fastening portion 38 of the fastening member 24 is away from the mounting member 30 (or the end wall 32) of the bracket 22 and the first post 60a.

Please refer to FIG. 7. When the fastening member 24 is at the first position P1 with respect to the bracket 22, the first engaging feature 44 of the bracket 22 is still not engaged with the second engaging feature 46 of the fastening member 24. Preferably, the contacting feature 27c of the operating member 27 is configured to abut the resilient arm 48b of the engaging member 48.

Figure 10:
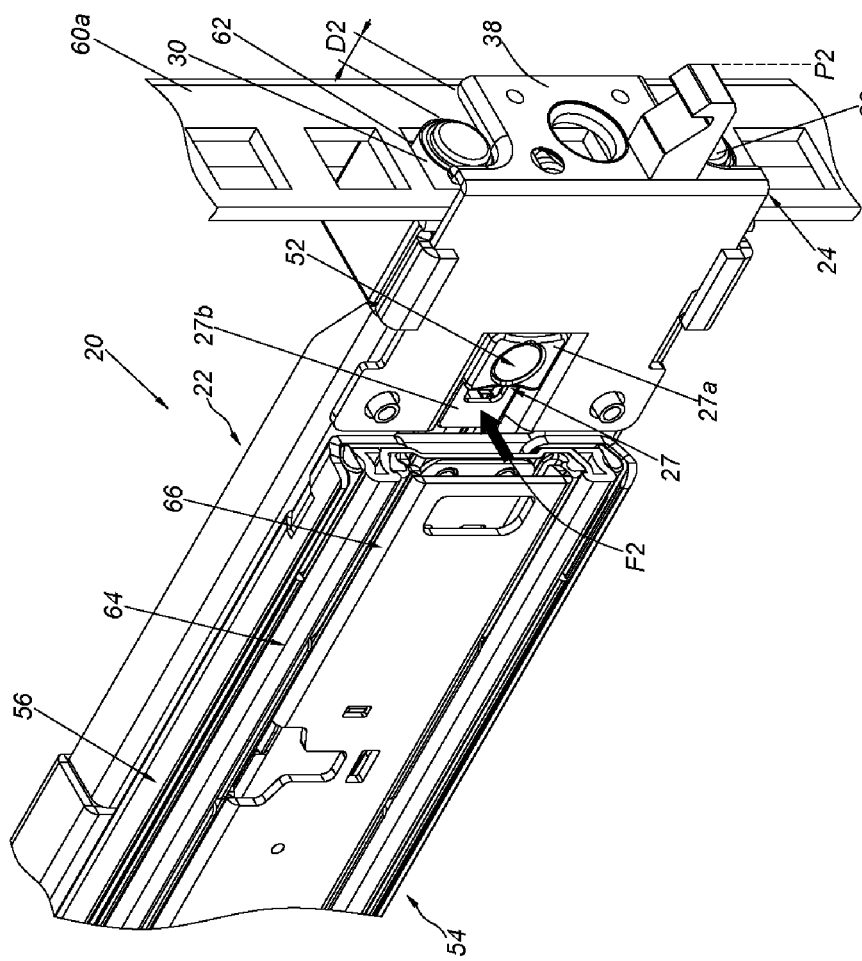
FIG. 10 is a diagram showing the bracket device of the slide rail being mounted to the rack through the mounting member, in which the fastening member is located at the second position, and an operating member is pushed by a force according to the embodiment of the present invention.

As shown in FIG. 8 and FIG. 9, when the fastening member 24 is applied with a first force F1, the fastening member 24 longitudinally displaces with respect to the bracket 22 from the first position P1 to a second position P2 (such as a locking position), the fastening portion 38 is close to the at least one mounting member 30 (or the end wall 32) and the first post 60a, such that the distance between the fastening portion 38 and the mounting member 30 (or the end wall 32) is changed from the first distance D1 to a second distance D2 which is smaller (or shorter). When the fastening member 24 is at the second position P2, the second engaging feature 46 of the fastening member 24 is corresponding to the first engaging feature 44 of the resilient arm 48b of the engaging member 48. Furthermore, the resilient member 26, in response to the second position P2 of the fastening member 24 with respect to the bracket 22, accumulates a resilient force. Preferably, with a resilient force provided by the resilient arm 48b of the engaging member 48, the first engaging feature 44 is engaged with the second engaging feature 46 of the fastening member 24, such that the fastening member 24 is kept at the second position P2 with respect to the bracket 22, and the resilient member 26 maintains the resilient force. When the fastening member 24 is at the second position P2 with respect to the bracket 22, the fastening portion 38 is close to the first post 60a so as to lock the first post 60a. That is, the slide rail assembly 54 can be stably mounted on the first post 60a, and cannot be arbitrarily dismounted from the first post 60a. As shown in FIG. 10, FIG. 11 and FIG. 12, when the first engaging feature 44 and the second engaging feature 46 are desired to be disengaged, a second force F2 can be applied to the operating portion 27b of the operating member 27, such that the contacting feature 27c of the operating member 27 pushes against the resilient arm 48b of the engaging member 48, and the resilient arm 48b of the engaging member 48 is lifted laterally with respect to the longitudinal wall 28 of the bracket 22, and the first engaging feature 44 is disengaged from the second engaging feature 46. The fastening member 24, in response to an resilient force F3 released from the resilient member 26, recovers to the first position P1 (shown in FIG. 6) from the second position P2 with respect to the bracket 22, such that the fastening portion 38 is away from the at least one mounting member 30. When the fastening member 24 is at the first position P1 with respect to the bracket 22 (shown in FIG. 6), the fastening portion 38 is away from the first post 60a and no longer locks the first post 60a. When the mounting member 30 is disengaged from the first post 60a, the bracket device 20 can be dismounted from the first post 60a. That is, the slide rail assembly 54 can be dismounted from the first post 60a. Furthermore, the operating member 27 can be omitted. When the bracket device 20 is not disposed with the operating member 27, and the first engaging feature 44 and the second engaging feature 46 are desired to be disengaged, a tool (not shown), such as a rod-shaped element can be operated from an outside (i.e., the side away from the bracket 22) of the fastening member 24 to pass through the elongated hole 50 and the through opening 34 to push against the resilient arm 48b of the engaging member 48, such that the resilient arm 48b of the engaging member 48 is lifted laterally with respect to the longitudinal wall 28 of the bracket 22, and the first engaging feature 44 is disengaged from the second engaging feature 46. Moreover, as shown in FIG. 6, when the fastening member 24 is located at the first position P1 with respect to the bracket 22, the first distance D1 is substantially greater than a distance between an end surface of the mounting member 30 and a wall surface of the first post 60a. As such, the space between the fastening portion 38 of the fastening member 24 and the wall surface of the first post 60a is sufficient, which can prevent the fastening portion 38 of the fastening member 24 from abutting the wall surface of the first post 60a when the mounting member 30 is disengaged from the hole 62 of the first post 60a, and thus the mounting member 30 can be smoothly disengaged from the hole 62 of the first post 60a.

To sum up, the bracket device 20 according to the embodiment of the present invention includes features as follows.

First, the fastening member 24 can longitudinally displace with respect to the bracket 22 from a first position P1 (such as an unlocking position) to a second position P2 (such as a locking position). When the fastening member 24 is at the second position P2, the resilient member 26 can maintain a resilient force. When the resilient force is released, the fastening member 24 can be recovered to the first position P1.

Second, when the fastening member 24 is at the first position P1, the fastening portion 38 of the fastening member 24 is unable to lock the first post 60a; when the fastening member 24 is at the second position P2, the fastening portion 38 of the fastening member 24 is able to lock the first post 60.

Third, with the operating member 27, it is convenient for an operator to apply a force to disengage the first engaging feature 44 from the second engaging feature 46.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bracket device, comprising:
a bracket comprising a longitudinal wall and at least one mounting member mounted adjacent to the longitudinal wall;
an engaging member comprising a connecting portion and a resilient arm, the connecting portion being connected to the longitudinal wall of the bracket, the resilient arm being extended from the connecting portion, the resilient arm having a first engaging feature;
a fastening member longitudinally displaceable with respect to the bracket, and the fastening member comprising a side wall, a fastening portion bent with respect to the side wall, a second engaging feature formed on the side wall and an elongated hole formed on the side wall;
a resilient member for providing a resilient force to the bracket and the fastening member; and
an operating member having a fixing portion and an operating portion, the fixing portion being connected to the longitudinal wall of the bracket via a fixing member passing through the elongated hole, the operating portion being flexibly connected to the fixing portion, the operating portion having a contacting feature passing through the elongated hole, the contacting feature corresponding to the resilient arm of the engaging member;
wherein when the fastening member displaces with respect to the bracket from an unlocking position to a locking position, the fastening portion is moved closer to the at least one mounting member, and the first engaging feature is engaged with the second engaging feature, such that the fastening member is kept at the locking position with respect to the bracket, and the resilient member maintains a resilient force;
wherein the resilient force is for recovering the fastening member to the unlocking position.

2. The bracket device of claim 1, wherein the bracket further comprises an end wall substantially perpendicularly connected to the longitudinal wall, and the at least one mounting member is mounted on the end wall.

3. The bracket device of claim 1, wherein the fastening portion of the fastening member is substantially perpendicularly connected to the side wall.

4. The bracket device of claim 1, wherein the longitudinal wall of the bracket comprises a first constraining feature, the side wall of the fastening member comprises a second constraining feature, and the first constraining feature cooperates with the second constraining feature.

5. The bracket device of claim 1, wherein the longitudinal wall of the bracket is connected to a slide rail.

6. A bracket device, comprising:
a bracket comprising a longitudinal wall and at least one mounting member mounted adjacent to the longitudinal wall;
an engaging member comprising a connecting portion and a resilient arm, the connecting portion being connected to the longitudinal wall of the bracket, the resilient arm being extended from the connecting portion, the resilient arm having a first engaging feature;
a fastening member displaceable with respect to the bracket, and the fastening member comprising a side wall, a fastening portion bent with respect to the side wall, a second engaging feature formed on the side wall and an elongated hole formed on the side wall;
a resilient member; and
an operating member having a fixing portion and an operating portion, the fixing portion being connected to the longitudinal wall of the bracket via a fixing member passing through the elongated hole, the operating portion being flexibly connected to the fixing portion, and the operating portion corresponding to the resilient arm of the engaging member;
wherein when the fastening member displaces with respect to the bracket from a first position to a second position, the fastening portion is moved closer to the at least one mounting member, and the first engaging feature is engaged with the second engaging feature, such that the fastening member is kept at the second position with respect to the bracket, and the resilient member maintains a resilient force;
wherein when the first engaging feature is disengaged from the second engaging feature, the fastening member recovers to the first position from the second position with respect to the bracket in response to the resilient force released from the resilient member, such that the fastening portion is moved farther away from the at least one mounting member.

7. The bracket device of claim 6, wherein the bracket further comprises an end wall substantially perpendicularly connected to the longitudinal wall, and the at least one mounting member is mounted on the end wall.

8. The bracket device of claim 6, wherein the fastening portion of the fastening member is substantially perpendicularly connected to the side wall.

9. The bracket device of claim 6, wherein the longitudinal wall of the bracket comprises a first constraining feature, the side wall of the fastening member comprises a second constraining feature, and the first constraining feature cooperates with the second constraining feature.

10. The bracket device of claim 6, wherein the longitudinal wall of the bracket is connected to a slide rail.

11. A bracket device adapted to mount a slide rail to a post with a plurality of holes formed thereon, the bracket device comprising:
- a bracket comprising a longitudinal wall and a mounting member mounted adjacent to the longitudinal wall, the longitudinal wall configured to be connected to the slide rail, and the mounting member for being mounted to one of the holes of the post;
- an engaging member comprising a connecting portion and a resilient arm, the connecting portion being connected to the longitudinal wall of the bracket, the resilient arm being extended from the connecting portion, the resilient arm having a first engaging feature;
- a fastening member longitudinally displaceable with respect to the bracket, and the fastening member comprising a side wall, a fastening portion bent with respect to the side wall, a second engaging feature formed on the side wall and an elongated hole formed on the side wall;
- a resilient member for providing resilient force to the bracket and the fastening member; and
- an operating member having a fixing portion and an operating portion, the fixing portion being connected to the longitudinal wall of the bracket via a fixing member passing through the elongated hole, the operating portion being flexibly connected to the fixing portion, the operating portion having a contacting feature passing through the elongated hole, the contacting feature corresponding to the resilient arm of the engaging member;
- wherein when the fastening member displaces with respect to the bracket from a first position to a second position, the fastening portion is configured to be moved closer to the post for locking the post, and the first engaging feature is engaged with the second engaging feature, such that the fastening member is kept at the second position with respect to the bracket, and the resilient member maintains a resilient force;
- wherein the resilient force is for recovering the fastening member to the first position, such that the fastening portion is configured to be moved farther away from the post for unlocking the post.

12. The bracket device of claim 11, wherein the bracket further comprises an end wall substantially perpendicularly connected to the longitudinal wall.

13. The bracket device of claim 11, wherein the mounting member is mounted on the end wall, and the fastening portion of the fastening member is substantially perpendicularly connected to the side wall.

14. The bracket device of claim 11, wherein the longitudinal wall of the bracket comprises a first constraining feature, the side wall of the fastening member comprises a second constraining feature, the first constraining feature cooperates with the second constraining feature, the first constraining feature is a long hole, the second constraining feature is a protruding object, and the protruding object passes through a portion of the long hole.

* * * * *